US012567852B2

(12) United States Patent
Ohnishi

(10) Patent No.: US 12,567,852 B2
(45) Date of Patent: Mar. 3, 2026

(54) PIEZOELECTRIC VIBRATION PLATE, PIEZOELECTRIC VIBRATION DEVICE, AND MANUFACTURING METHOD FOR PIEZOELECTRIC VIBRATION DEVICE

(71) Applicant: Daishinku Corporation, Kakogawa (JP)

(72) Inventor: Manabu Ohnishi, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 1016 days.

(21) Appl. No.: 17/762,768

(22) PCT Filed: Jul. 29, 2020

(86) PCT No.: PCT/JP2020/029023
§ 371 (c)(1),
(2) Date: Mar. 23, 2022

(87) PCT Pub. No.: WO2021/059731
PCT Pub. Date: Apr. 1, 2021

(65) Prior Publication Data
US 2022/0416759 A1 Dec. 29, 2022

(30) Foreign Application Priority Data
Sep. 26, 2019 (JP) ................................ 2019-175261

(51) Int. Cl.
| | |
|---|---|
| *H03H 9/10* | (2006.01) |
| *H03H 3/02* | (2006.01) |
| *H03H 9/19* | (2006.01) |

(52) U.S. Cl.
CPC ............ *H03H 9/1035* (2013.01); *H03H 3/02* (2013.01); *H03H 9/19* (2013.01); *H03H 2003/022* (2013.01)

(58) Field of Classification Search
CPC ........ H03H 9/19; H03H 9/1035; H03H 9/131; H03H 3/02; H03H 9/17; H03H 2003/022
See application file for complete search history.

(56) References Cited

U.S. PATENT DOCUMENTS

| | | | |
|---|---|---|---|
| 6,621,011 B1 | 9/2003 | Daidai et al. | |
| 2009/0108709 A1* | 4/2009 | Tsuchido | ............... H03H 9/132 310/364 |

(Continued)

FOREIGN PATENT DOCUMENTS

| | | |
|---|---|---|
| JP | 55-034575 A | 3/1980 |
| JP | 2000-252375 A | 9/2000 |

(Continued)

*Primary Examiner* — J. San Martin
(74) *Attorney, Agent, or Firm* — Norris McLaughlin, P.A.

(57) ABSTRACT

The piezoelectric vibration plate includes a piezoelectric substrate, a first driving electrode and a second driving electrode formed on main surfaces on both sides of the piezoelectric substrate, and a first mounting terminal and a second mounting terminal respectively connected to the first driving electrode and the second driving electrode. The first and second mounting terminals each have a metal film for mounting purpose formed on the piezoelectric substrate and a metal film for driving purpose formed on the metal film for mounting purpose. The metal films for mounting purpose each include a solder-resistant metal film. The metal films for driving purpose are formed in continuity with the first and second driving electrodes and constitute the first and second driving electrodes.

14 Claims, 8 Drawing Sheets

(56) References Cited

U.S. PATENT DOCUMENTS

| | | | | |
|---|---|---|---|---|
| 2009/0267460 A1* | 10/2009 | Satoh | ...................... | H03H 9/17 |
| | | | | 29/25.35 |
| 2014/0042874 A1* | 2/2014 | Takahashi | .............. | H10N 30/40 |
| | | | | 310/351 |
| 2020/0212874 A1* | 7/2020 | Mizugaki | ................. | H03B 5/32 |
| 2022/0416760 A1* | 12/2022 | Ohnishi | .............. | H03H 9/1035 |

FOREIGN PATENT DOCUMENTS

| JP | 2005-184325 A | 7/2005 |
|---|---|---|
| JP | 2009-049857 A | 3/2009 |
| JP | 2012-114776 A | 6/2012 |
| JP | 2015-192279 A | 11/2015 |
| JP | 2017-085412 A | 5/2017 |
| JP | 6275526 B2 * | 2/2018 |

* cited by examiner

F I G. 2
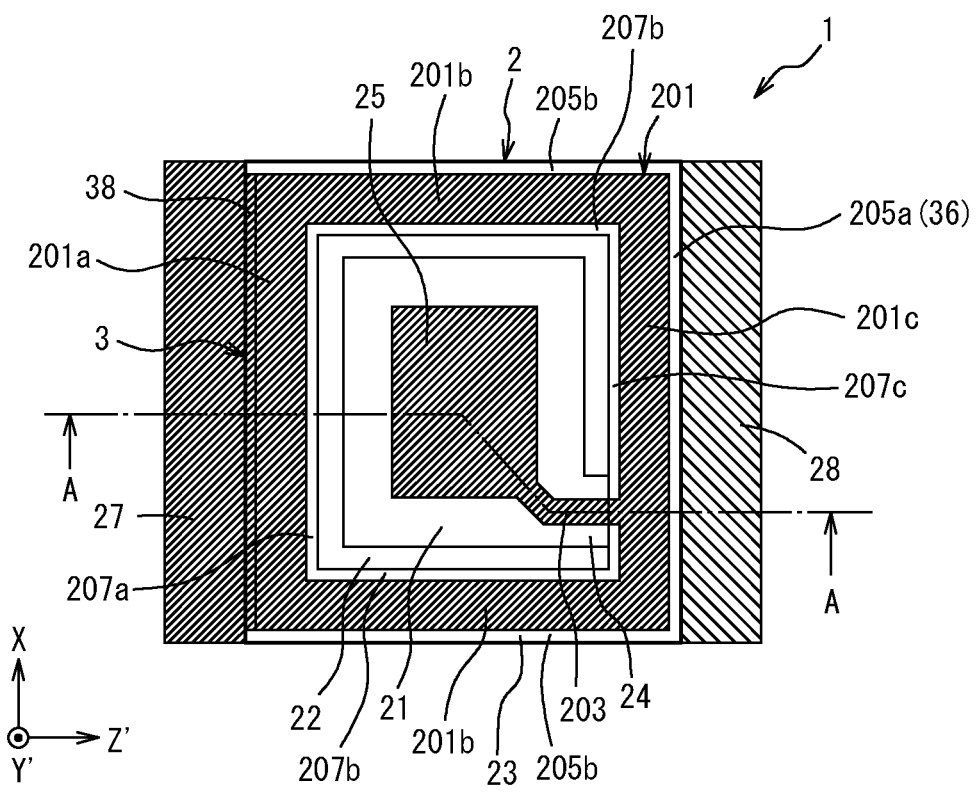
F I G. 3
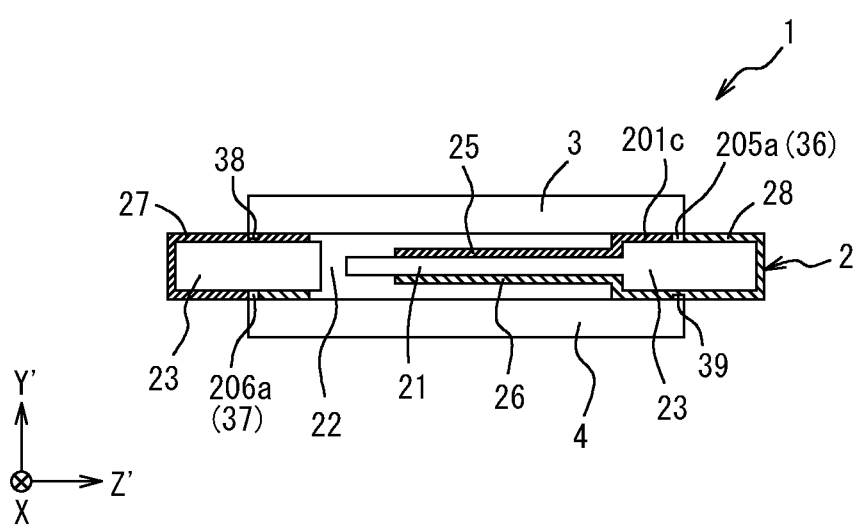

F I G. 4
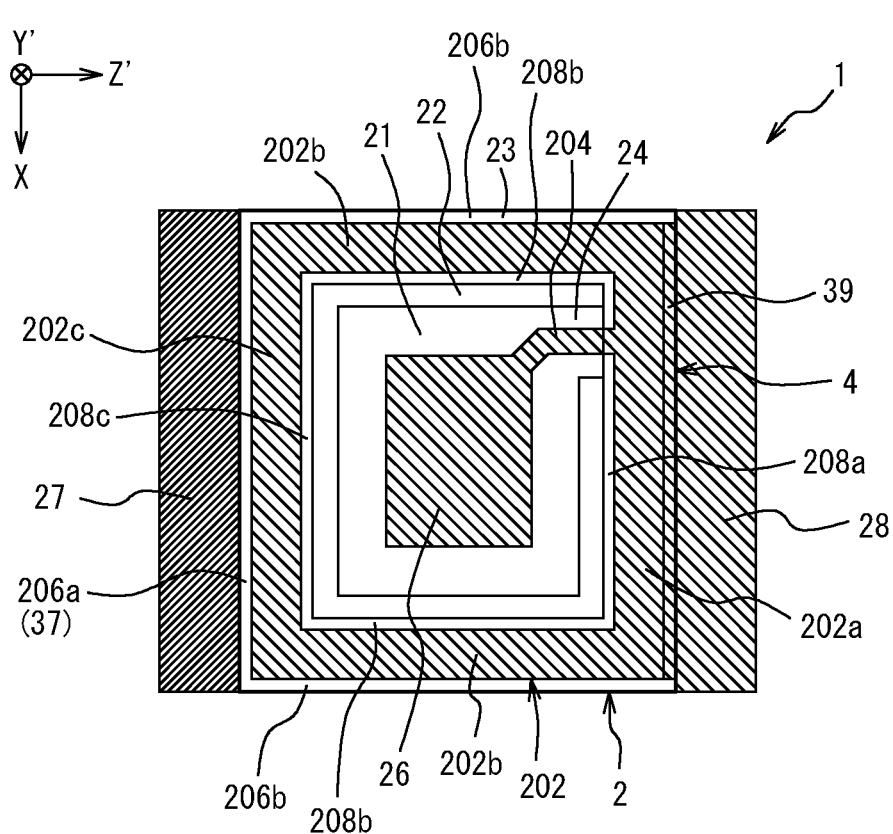

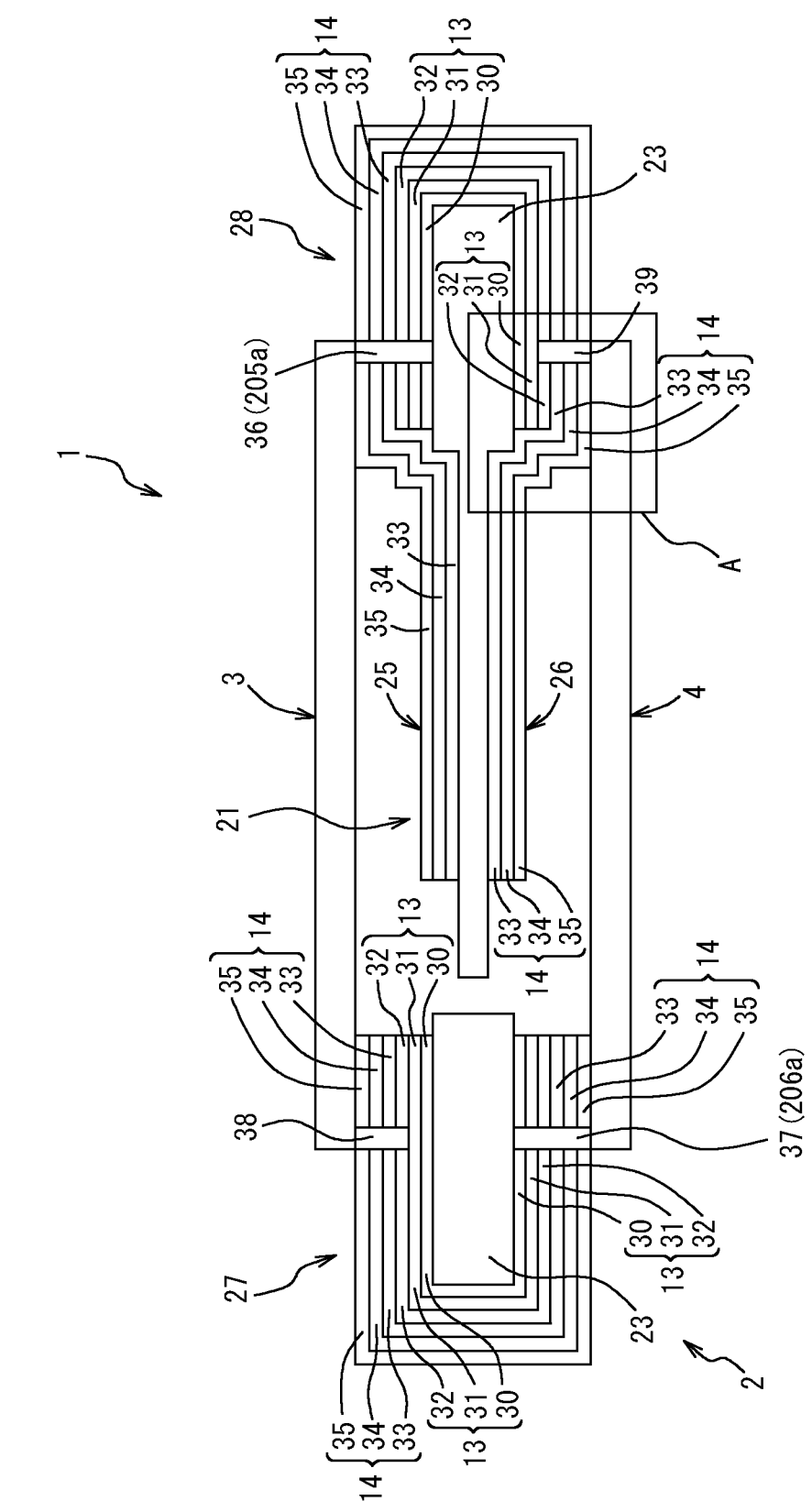
F I G. 5

F I G. 6
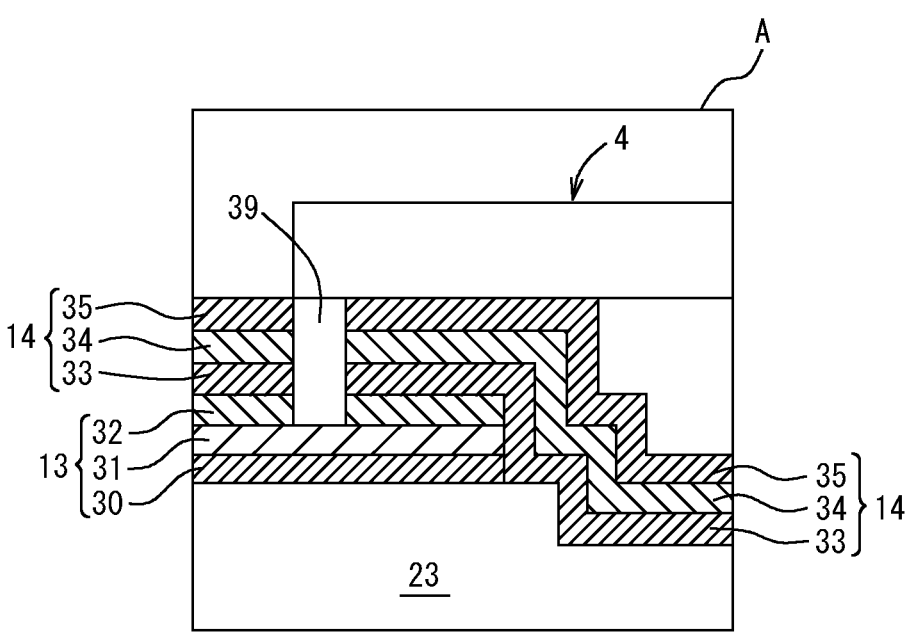

F I G.  7 A
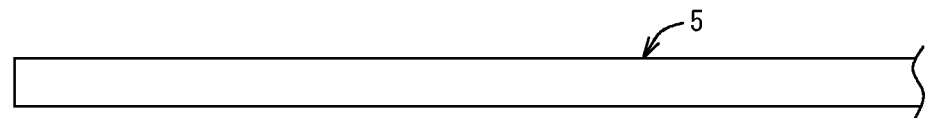
F I G.  7 B
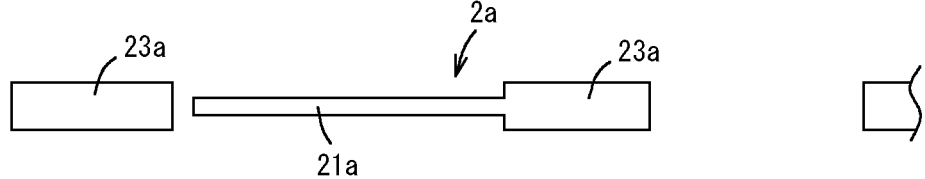
F I G.  7 C
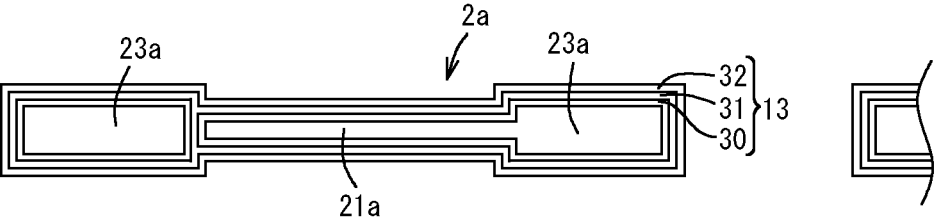
F I G.  7 D
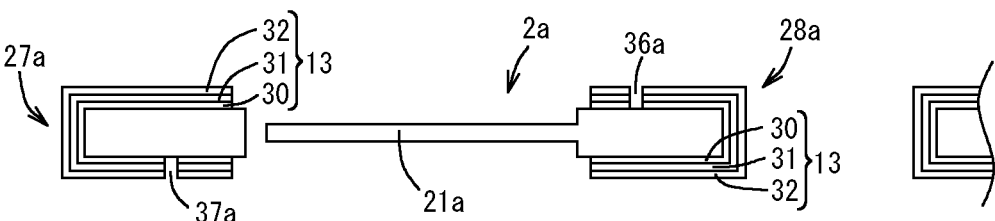

F I G. 7 E
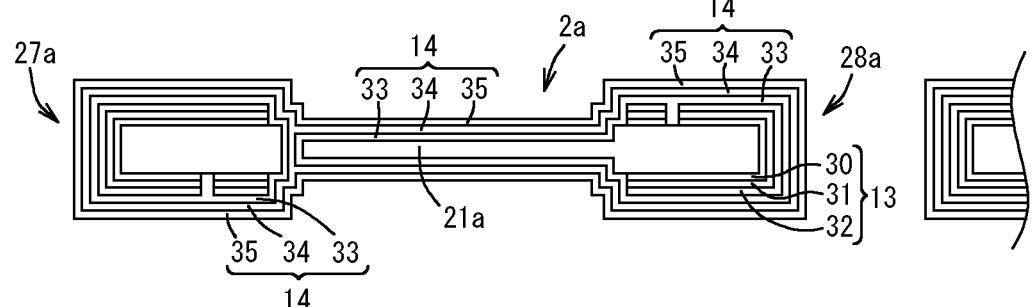
F I G. 7 F
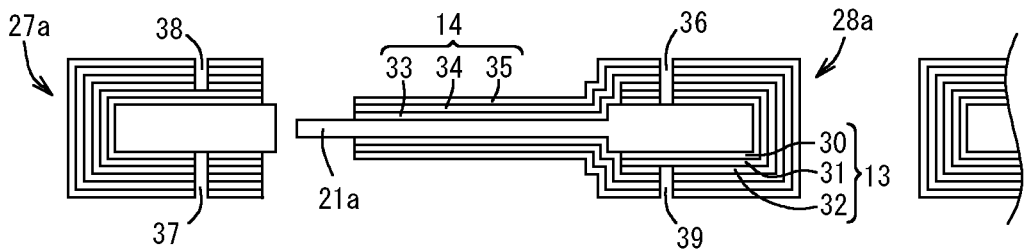
F I G. 7 G
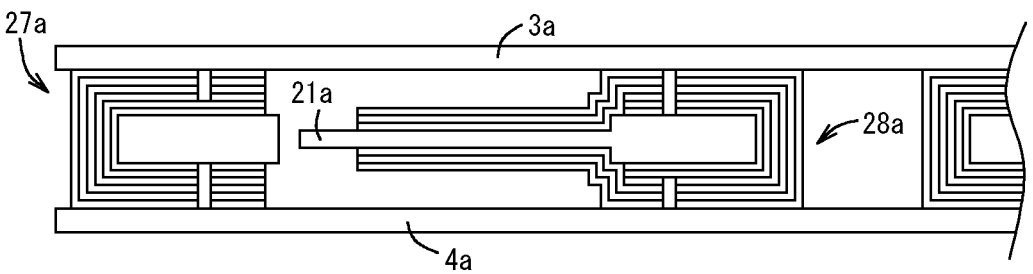
F I G. 7 H
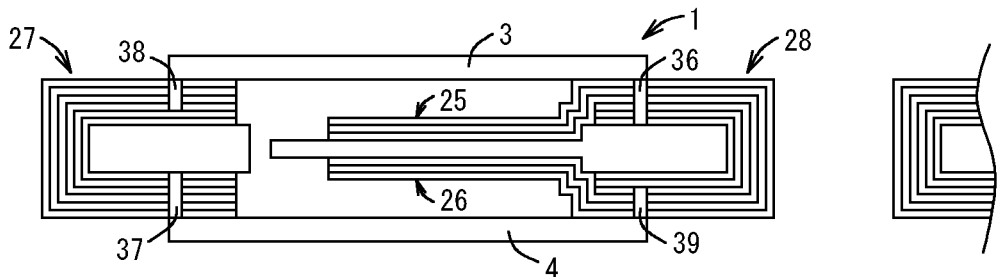

F I G . 8
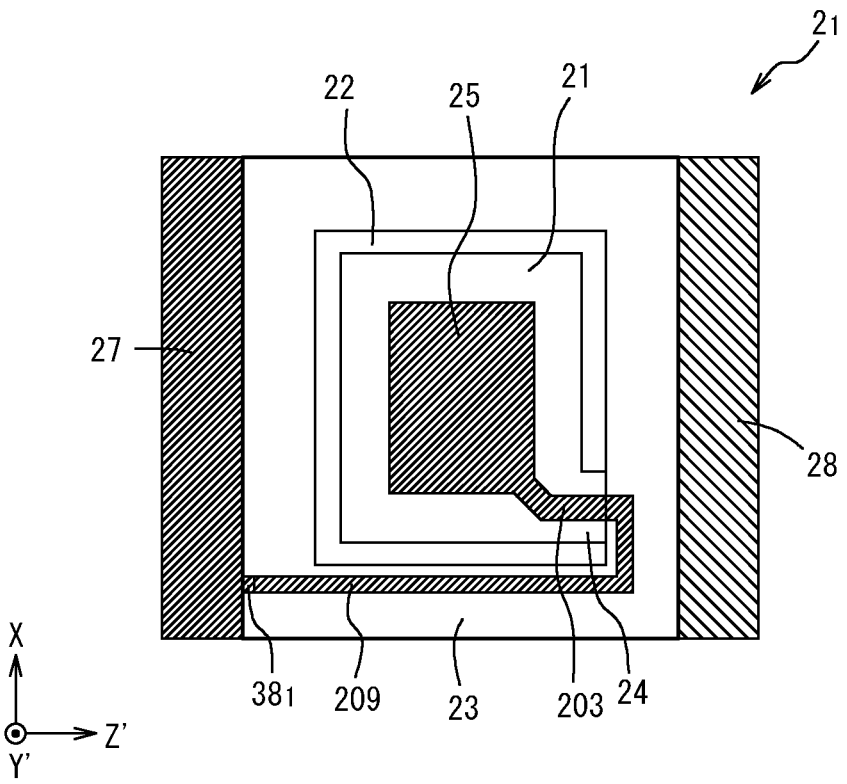
F I G . 9
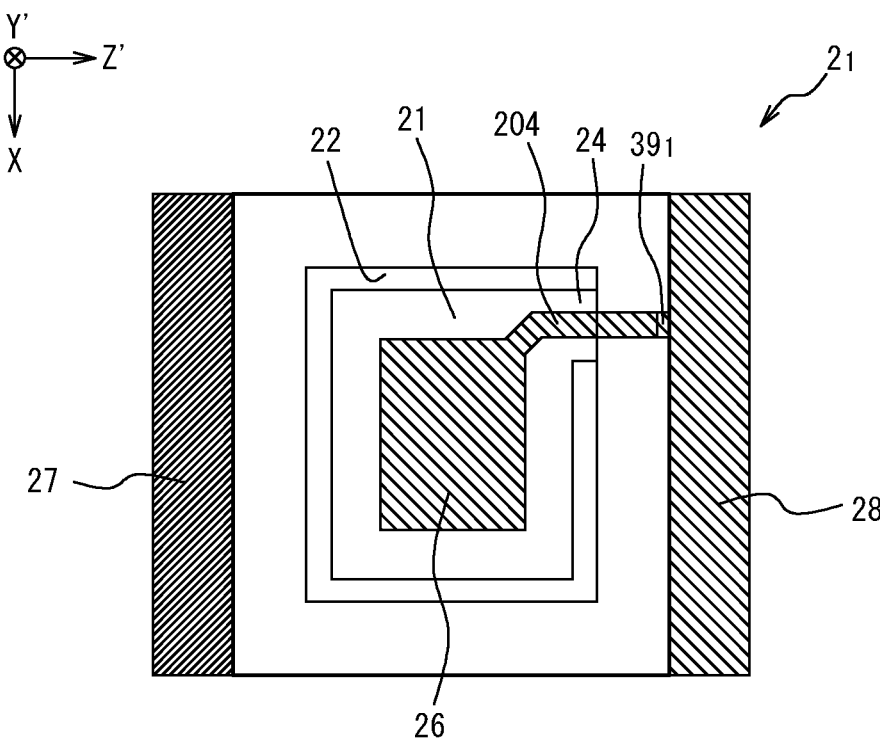

PIEZOELECTRIC VIBRATION PLATE, PIEZOELECTRIC VIBRATION DEVICE, AND MANUFACTURING METHOD FOR PIEZOELECTRIC VIBRATION DEVICE

TECHNICAL FIELD

This invention relates to a piezoelectric vibration plate equipped with mounting terminals, a piezoelectric vibration device using the piezoelectric vibration plate, and a manufacturing method for the piezoelectric vibration device.

BACKGROUND ART

Surface-mounted crystal vibrators are typical examples of the piezoelectric vibration devices, for instance, piezoelectric vibrators. Such surface-mounted crystal vibrators have so far been and are currently used very often in a broad range of applications. Patent literature 1 describes an example of the surface-mounted crystal vibrators. In the crystal vibrator of this example is used a ceramic-made, box-shaped base containing electrodes held therein and having an opening on its upper side. A crystal vibration piece is mounted on this base in the following manner; electrodes are led out from driving electrodes formed on surfaces on both sides of the crystal vibration piece, and these led-out electrodes are fixedly joined, with an electrically conductive adhesive, to the electrodes of the base. Then, a lid member is firmly joined to the opening of the base mounted with the crystal vibration piece, so that the base is air-tightly sealed. On an outer bottom surface of the base are formed terminals for surface mounting of this crystal vibrator.

CITATION LIST

Patent Literature

Patent Literature 1: JP 2005-184325 A

SUMMARY OF INVENTION

Technical Problems

In most of the piezoelectric vibrators obtained as described above, the package is so structured that a metal- or glass-made lid member is joined to a ceramic base. Such packages are often costly, which may inevitably lead to higher prices of the piezoelectric vibrators.

In the surface-mounted piezoelectric vibrators, mounting terminals are joined and mounted to a target member, for example, a circuit board, with a joining material like solder. The surface-mounted piezoelectric vibrators thus structured may involve the risk of an unfavorable event called "solder leaching", which conventionally occurs with a metal-containing mounting terminal(s). Specifically, the solder leaching refers to diffusion of the metal into the solder adhered to the mounting terminal(s), possibly leading to conduction failure. Thus, effective measures against the solder-associated conduction failure may become highly necessary.

To address these issues of the known art, this invention is directed to providing a piezoelectric vibration plate and a piezoelectric vibration device inexpensively producible without the risk of conduction failure.

Solutions to the Problems

To this end, this invention provides the following technical features.

1] A piezoelectric vibration plate according to this invention includes:

a piezoelectric substrate having a substantially rectangular shape in plan view;

a first driving electrode and a second driving electrode formed on main surfaces on both sides of the piezoelectric substrate; and a first mounting terminal and a second mounting terminal disposed at ends on both sides of the piezoelectric substrate in a direction along one of two pairs of opposing sides of the substantially rectangular shape in plan view, the first mounting terminal and the second mounting terminal being respectively connected to the first driving electrode and the second driving electrode.

The piezoelectric vibration plate is further characterized in that:

the first mounting terminal and the second mounting terminal each have a metal film for mounting purpose formed on the piezoelectric substrate and a metal film for driving purpose formed on the metal film for mounting purpose;

the metal films for mounting purpose each include a solder-resistant metal film; and the metal films for driving purpose are formed in continuity with the first driving electrode and the second driving electrode, and the metal films for driving purpose constitute the first driving electrode and the second driving electrode.

In the piezoelectric vibration plate according to this invention, the first and second mounting terminals are joined to a target member, for example, a circuit board, with a joining material like solder, and the first and second mounting terminals are each provided with the metal film for mounting purpose including the solder-resistant metal film. The solder-resistant metal films of the respective metal films for mounting purpose may effectively prevent further spread of the solder leaching, consequently avoiding the risk of conduction failure. Further advantageously, the metal films for driving purpose that constitute the first and second driving electrodes are formed on the metal films for mounting purpose of the first and second mounting terminals in continuity with the first and second driving electrodes. Thus, the first and second mounting terminals are connectable to the first and second driving electrodes.

Conventionally, piezoelectric vibration pieces may be each housed in a box-shaped base equipped with mounting terminals and having an opening on its upper side. The piezoelectric vibration plate described herein, however, has the first and second mounting terminals that are connected to the first and second driving electrodes. This makes such a conventional means unnecessary, eliminating the need for high-priced bases.

2] In a preferred embodiment of this invention, a dividing groove may be formed in each of the metal films for mounting purpose and the metal films for driving purpose on the metal films for mounting purpose in a manner that traverses a direction along the one of two pairs of opposing sides of the piezoelectric substrate, the dividing groove dividing the metal film for mounting purpose in part and the metal film for driving purpose to allow exposure of the solder-resistant metal film.

The mounting terminals are disposed at ends on both sides of the piezoelectric substrate in a direction along one of the two pairs of opposing sides of the rectangular shape in plan view. According to this embodiment, the metal films for mounting purpose in part and the metal films for driving purpose of the mounting terminals at these both ends are each divided by the dividing groove exposing the solder-resistant metal film in a manner that traverses the direction along one of the two pairs of opposing sides.

In the piezoelectric substrate rectangular in plan view, therefore, the metal films for mounting purpose in part and the metal films for driving purpose of the mounting terminals disposed at the ends are each divided by the dividing groove serving as boundary into two regions; an outer region and an inner region, in the direction along the opposing sides of the rectangular shape.

The unfavorable event, solder leaching, if occurs on the outer side of the metal films for driving purpose and the metal films for mounting purpose of the mounting terminals, may be prevented by these dividing grooves exposing the solder-resistant metal films from further spreading toward the inner side of these metal films.

3] In one embodiment of this invention, the solder-resistant metal films may each contain at least one selected from the group consisting of Ni and Ni-containing alloys.

In this embodiment, the solder-resistant metal film containing at least one of Ni or an Ni-containing alloy may prevent the solder leaching from further spreading into other regions.

4] A piezoelectric vibration device according to this invention includes a piezoelectric vibration plate, the piezoelectric vibration plate including:
  a piezoelectric substrate having a substantially rectangular shape in plan view;
  a first driving electrode and a second driving electrode formed on main surfaces on both sides of the piezoelectric substrate; and
  a first mounting terminal and a second mounting terminal disposed at ends on both sides of the piezoelectric substrate in a direction along one of two pairs of opposing sides of the substantially rectangular shape in plan view, the first mounting terminal and the second mounting terminal being respectively connected to the first driving electrode and the second driving electrode.

The piezoelectric vibration device according to this invention further includes a first sealing member and a second sealing member, the first sealing member and the second sealing member being respectively adherable to the main surfaces of the piezoelectric vibration plate in a manner that cover the first driving electrode and the second driving electrode of the piezoelectric vibration plate.

The piezoelectric vibration device is further characterized in that:
  at least one of the first sealing member or the second sealing member is a film including a resin;
  the first mounting terminal and the second mounting terminal each have a metal film for mounting purpose formed on the piezoelectric substrate and a metal film for driving purpose formed on the metal film for mounting purpose;
  the metal films for mounting purpose each include a solder-resistant metal film; and
  the metal films for driving purpose are formed in continuity with the first driving electrode and the second driving electrode, and the metal films for driving purpose constitute the first driving electrode and the second driving electrode.

In the piezoelectric vibration device according to this invention, the first and second mounting terminals to be joined to a target member, for example, a circuit board with a joining material like solder, has the metal films for mounting purpose including the solder-resistant metal films. The solder-resistant metal films of the metal films for mounting purpose may prevent further spread of the solder leaching and thereby avoid the risk of conduction failure. Further advantageously, the metal films for driving purpose that constitute the first and second driving electrodes are formed on the metal films for mounting purpose of the first and second mounting terminals in continuity with the first and second driving electrodes. Thus, the first and second mounting terminals are connectable to the first and second driving electrodes.

Conventionally, piezoelectric vibration pieces may be each housed in a box-shaped base equipped with mounting terminals and having an opening on its upper side. The piezoelectric vibration plate described herein, however, has the first and second mounting terminals that are connected to the first and second driving electrodes. This makes such a conventional means unnecessary, eliminating the need for high-priced bases.

Of the first and second sealing members to be adhered to the main surfaces of the piezoelectric vibration plate, the resin-containing film is used as at least one of these sealing members. This may conduce to lower production cost than use of a metal-made or glass-made lid for sealing.

5] In a preferred embodiment of this invention, the first sealing member and the second sealing member may be both the film including a resin.

According to these embodiments in which the sealing members are both the resin-containing film, high-priced bases and lids may become unnecessary, conducing to further cost reduction.

6) In one embodiment of this invention, a dividing groove is formed in each of the metal films for mounting purpose and the metal films for driving purpose on the metal films for mounting purpose in a manner that traverses a direction along the one of two pairs of opposing sides of the piezoelectric substrate, and the dividing groove divides the metal film for mounting purpose in part and the metal film for driving purpose in a manner that the solder-resistant metal film is exposed.

The mounting terminals are disposed at ends on both sides of the piezoelectric substrate in a direction along one of two pairs of opposing sides of the rectangular shape in plan view. According to this embodiment, the metal films for mounting purpose in part and the metal films for driving purpose of the mounting terminals at these both ends are each divided by the dividing groove exposing the solder-resistant metal film in a manner that traverses the direction along one of the two pairs of opposing sides. In the piezoelectric substrate rectangular in plan view, therefore, the metal films for mounting purpose in part and the metal films for driving purpose of the mounting terminals disposed at the ends are each divided by the dividing groove serving as boundary into two regions; an outer region and an inner region in the direction along the opposing sides of the rectangular shape.

Thus, the solder leaching, if occurs on the outer side of the metal films for driving purpose and the metal films for mounting purpose of the mounting terminals, may be prevented by the dividing grooves exposing the solder-resistant metal films from further spreading toward the inner side of these metal films.

7] In other embodiments of this invention, the film including a resin may be adhered to the piezoelectric vibration plate in a manner that the dividing groove is covered with the film.

According to this embodiment in which the resin-containing film is adhered to the piezoelectric vibration plate so as to cover the dividing groove, a solder used to join the mounting terminal to a target member such as a circuit board may be unlikely to advance into the dividing groove of the mounting terminal. Thus, undesired spread of the solder leaching may be more effectively controlled by the film-covered dividing grooves.

In one embodiment of this invention, the piezoelectric vibration plate may include: a vibrating portion having the first driving electrode and the second driving electrode formed on the main surfaces of the piezoelectric substrate; and an outer frame coupled to the vibrating portion through a coupling means. The outer frame surrounds, at a position spaced from the vibrating portion, the outer circumference of the vibration portion smaller in thickness. Circumferential ends of the film are adhered to the outer frame to seal the vibrating portion.

According to this embodiment, circumferential ends of the film are adhered to the outer frame surrounding the outer circumference of the vibrating portion. Thus, the vibrating portion thinner than the outer frame may be sealed well without any contact with the film adhered to the outer frame.

9] In other embodiments of this invention, one of main surfaces on both sides of the outer frame may have a first sealing pattern to which the first sealing pattern is adherable, the first sealing pattern being formed in a manner that surrounds the vibrating portion and that allows the first driving electrode and the first mounting terminal to connect to each other, and another one of main surfaces the outer frame may have a second sealing pattern to which the second sealing pattern is adherable, the second sealing pattern being formed in a manner that surrounds the vibrating portion and that allows the second driving electrode and the second mounting terminal to connect to each other.

According to this embodiment, the first and second sealing patterns formed on the main surfaces of the outer frame may facilitate electrical connection between the first and second driving electrodes and the first and second mounting terminals. Further advantageously, the vibrating portion may be securely sealed by firmly bonding the film to the first and second sealing patterns surrounding the vibrating portion.

10] In other embodiments of this invention, the first mounting terminal and the second mounting terminal may be formed on both of the main surfaces of the outer frame, the first mounting terminals on the main surfaces being connected to each other, the second mounting terminals on the main surfaces being connected to each other.

According to these embodiments that allow the mounting terminals on the main surfaces to be electrically interconnected, either one of the main surfaces of the piezoelectric vibration device may be used at the time of mounting this device to, for example, a circuit board.

11] In a preferred embodiment of this invention, the solder-resistant metal films may each contain at least one selected from the group consisting of Ni and Ni-containing alloys.

According the these embodiments, the solder-resistant metal film containing at least one of Ni or an Ni-containing alloy may effectively prevent further spread of the solder leaching into other regions.

A manufacturing method for a piezoelectric vibration device according to this invention includes preparing a piezoelectric wafer in order to provide a piezoelectric vibration plate, the piezoelectric vibration plate including:

a piezoelectric substrate having a substantially rectangular shape in plan view;

a first driving electrode and a second driving electrode formed on main surfaces on both sides of the piezoelectric substrate; and a first mounting terminal and a second mounting terminal formed at ends on both sides of the piezoelectric substrate in a direction along one of two pairs of opposing sides of the substantially rectangular shape in plan view, the first mounting terminal and the second mounting terminal being respectively connected to the first driving electrode and the second driving electrode.

The manufacturing method according to this invention further includes:

an external shape forming step of forming external shapes of a plurality of the piezoelectric substrates on the piezoelectric wafer;

a metal film for mounting purpose forming step of patterning a metal film for mounting purpose including a solder-resistant metal film on each of the piezoelectric substrates obtained in the external shape forming step to form the metal film for mounting purpose in regions that will constitute the first and second mounting terminals;

a metal film forming step of patterning a metal film for driving purpose on each of the piezoelectric substrates respectively having thereon the metal films for mounting purpose and on each of the metal films for mounting purpose formed earlier in the metal film for mounting purpose forming step to form the metal film for driving purpose in regions that will constitute the first and second mounting terminals and in regions that will constitute the first and second driving electrodes, thus obtaining the piezoelectric vibration plate;

an adhering step of adhering a film including a resin to at least one of the main surfaces in each of a plurality of the piezoelectric vibration plates respectively having thereon the metal films for driving purpose formed earlier in the metal film forming step to seal at least one of the first driving electrode or the second driving electrode; and a separating step of separating the piezoelectric vibration plates into individual pieces after the film is adhered thereto in the adhering step.

The manufacturing method according to this invention is further characterized in that the metal film forming step further include forming the metal films for driving purpose on the metal films for mounting purpose in regions that will constitute the first and second mounting terminals in continuity with the metal films for driving purpose in regions that will constitute the first and second driving electrodes.

The manufacturing method for the piezoelectric vibration device according to this invention includes the following steps. In the metal film for mounting purpose forming step, the metal film for mounting purpose is formed in regions on the piezoelectric substrate that will constitute the first and second mounting terminals. In the metal film forming step, the metal film for driving purpose is formed in regions that will constitute the first and second driving electrodes and in regions that will constitute the first and second mounting terminals on the solder-resistant metal films and on the piezoelectric substrate, and the metal film for driving purpose is formed on the metal films for mounting purpose in continuity with the metal films for driving purpose in regions that will constitute the first and second driving electrodes. This manufacturing method, therefore, may effectively control further spread of the solder leaching, and may accordingly avoid the risk of conduction failure. Further advantageously, the metal films for driving purpose may facilitate electrical connection between the first and second mounting terminals and the first and second driving electrodes.

Conventionally, piezoelectric vibration pieces may be each housed in a box-shaped base equipped with mounting terminals and having an opening on its upper side. The piezoelectric vibration plate described herein, however, has the first and second mounting terminals that are connected to the first and second driving electrodes. This makes such a conventional means unnecessary, eliminating the need for high-priced bases.

In the adhering step, the resin-containing film is adhered for sealing to at least one of the both main surfaces of each piezoelectric vibration plate. This may conduce to cost reduction, as compared with use of a metal-made or glass-made lid for sealing.

13] In a preferred embodiment of this invention, in the adhering step, the film including a resin may be adhered to both of the main surfaces of the piezoelectric vibration plates respectively having thereon the metal films for driving purpose formed earlier in the metal film forming step to seal the first and second driving electrodes.

According to this embodiment in which the resin-containing film is bonded to both of the main surfaces of each piezoelectric vibration plate, high-priced bases and lids may become unnecessary, leading to further cost reduction.

14] In one embodiment of this invention, in the metal film forming step, a dividing groove may be formed in each of the metal films for mounting purpose and the metal films for driving purpose on the metal films for mounting purpose in a manner that traverses a direction along the one of two pairs of opposing sides of the piezoelectric substrate, the dividing groove dividing the metal film for mounting purpose in part and the metal film for driving purpose to allow exposure of the solder-resistant metal film.

The mounting terminals are disposed at both ends in a direction along one of the two pairs of opposing sides of the rectangular shape in plan view of the piezoelectric substrate. According to this embodiment, the metal films for mounting purpose in part and the metal films for driving purpose of the mounting terminals at these both ends are each divided by the dividing groove exposing the solder-resistant metal film in a manner that traverses the direction along one of the two pairs of opposing sides. In the piezoelectric substrate rectangular in plan view, therefore, the metal films for mounting purpose in part and the metal films for driving purpose of the mounting terminals disposed at the ends are each divided by the dividing groove serving as boundary into two regions; an outer region and an inner region, in a direction along the opposing sides of the rectangular shape.

The unfavorable event, solder leaching, if occurs on the outer side of the metal films for driving purpose and the metal films for mounting purpose of the mounting terminals, may be prevented by these dividing grooves exposing the solder-resistant metal films from further spreading toward the inner side of these metal films.

15] In other embodiments of this invention, in the adhering step, the film including a resin may be adhered to the piezoelectric vibration plate in a manner that the dividing groove is covered with the film.

According to these embodiments that allow the resin-containing film to adhere to the piezoelectric vibration plate in a manner that the dividing groove is covered with this film, a solder used to join the mounting terminals to a target member such as a circuit board may be unlikely to advance into the dividing groove(s) of the mounting terminal(s). Thus, undesired spread of the solder leaching may be more effectively controlled by the film-covered dividing grooves.

Effects of the Invention

According to this invention, the first and second mounting terminals to be joined to, for example, a circuit board with a joining material like a solder each have the metal film for mounting purpose including the solder-resistant metal film. This solder-resistant metal film may effectively control undesired spread of the solder leaching, avoiding the risk of conduction failure. Further advantageously, the metal films for driving purpose that constitute the first and second driving electrodes are formed on the metal films for mounting purpose of the first and second mounting terminals in continuity with the first and second driving electrodes. Thus, the first and second mounting terminals are connectable to the first and second driving electrodes.

Conventionally, piezoelectric vibration pieces may be each housed in a box-shaped base equipped with mounting terminals and having an opening on its upper side. The piezoelectric vibration plate described herein, however, has the first and second mounting terminals that are connected to the first and second driving electrodes. This makes such a conventional means unnecessary, eliminating the need for high-priced bases.

Of the first and second sealing member to be adhered to the main surfaces of the piezoelectric vibration plate, the resin-containing film is used as at least one of these sealing members. This may conduce to lower production cost than use of a metal-made or glass-made lid for sealing.

BRIEF DESCRIPTION OF THE DRAWINGS

FIG. 2 is a schematic plan view of the crystal vibrator illustrated in FIG. 1.

FIG. 3 is a schematic view in cross section of the crystal vibrator along A-A line illustrated in FIG. 2.

FIG. 4 is a schematic bottom view of the crystal vibrator illustrated in FIG. 1.

FIG. 5 is a schematic enlarged view in cross section of metal films illustrated in FIG. 3.

FIG. 6 is a drawing that illustrates in cross section of a rectangular section "A" enlarged and turned upside down.

FIG. 6 is a schematic plan view illustrated to describe the formation of end surfaces of a second cutout.

FIG. 7A is a schematic view in cross section of steps of manufacturing the crystal vibrator illustrated in FIG. 1.

FIG. 7B is a schematic view in cross section of steps of manufacturing the crystal vibrator illustrated in FIG. 1

FIG. 7C is a schematic view in cross section of steps of manufacturing the crystal vibrator illustrated in FIG. 1.

FIG. 7D is a schematic view in cross section of steps of manufacturing the crystal vibrator illustrated in FIG. 1.

FIG. 7E is a schematic view in cross section of steps of manufacturing the crystal vibrator illustrated in FIG. 1.

FIG. 7F is a schematic view in cross section of steps of manufacturing the crystal vibrator illustrated in FIG. 1.

FIG. 7G is a schematic view in cross section of steps of manufacturing the crystal vibrator illustrated in FIG. 1.

FIG. 7H is a schematic view in cross section of steps of manufacturing the crystal vibrator illustrated in FIG. 1.

FIG. 8 is a schematic plan view of a crystal vibration plate constituting a crystal vibrator according to another embodiment of this invention.

FIG. 9 is a schematic bottom view of the crystal vibration plate illustrated in FIG. 8.

DESCRIPTION OF THE EMBODIMENTS

An embodiment of this invention is hereinafter described in detail referring to the accompanying drawings. In the description of this embodiment, a crystal vibrator is used as an example of the crystal vibration device.

Figure 1:
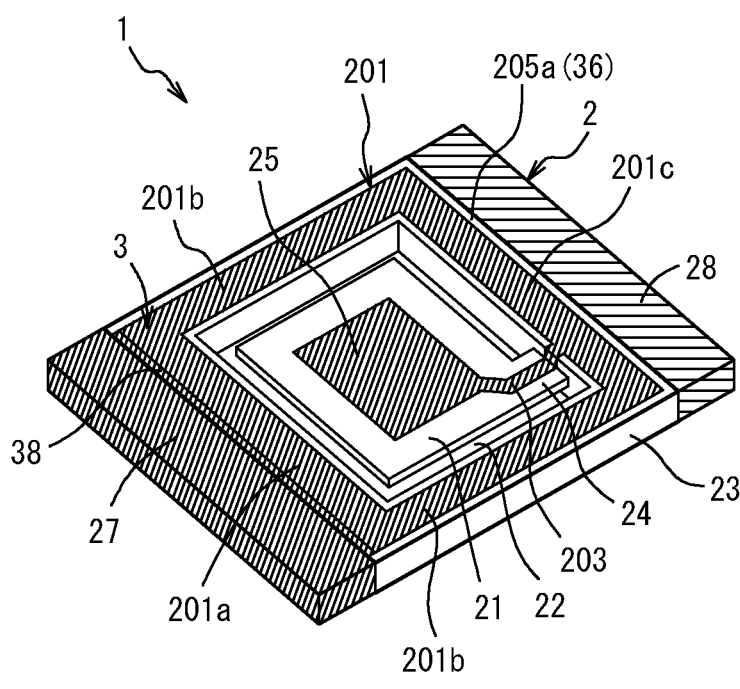
FIG. 1 is a schematic perspective view of a crystal vibrator according to an embodiment of this invention.
Figure 1:
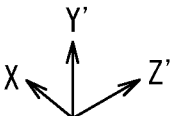

FIG. 1 is a schematic perspective view of a crystal vibrator according to an embodiment of this invention. FIG. 2 is a schematic plan view of the crystal vibrator illustrated in FIG. 1. FIG. 3 is a schematic view in cross section of the crystal vibrator along A-A line illustrated in FIG. 2. FIG. 4 is a schematic bottom view of the crystal vibrator illustrated in FIG. 1. In FIGS. 3, 5, 6 and 7A to 7H, the thicknesses of resin films and metal films may be exaggerated for the purpose of illustration.

A crystal vibrator 1 according to this embodiment illustrated in these drawings includes an AT-cut crystal vibration plate 2; an example of the piezoelectric vibration plate, a first resin film 3; an example of the first sealing member, and a second resin film 4; an example of the second sealing member. The first resin film 3 covers and seals one of the front and back main surfaces of the crystal vibration plate 2. The second resin film 4 covers and seals the other one of the front and back main surfaces of the crystal vibration plate 2.

This crystal vibrator 1 has a cuboidal shape and is rectangular in plan view. In this embodiment, the crystal vibrator 1 is relatively small in size and height; 1.2 mm×1.0 mm square, and 0.2 mm in thickness.

The size and thickness of the crystal vibrator 1 are not necessarily thus limited. The crystal vibrator 1 may be formed in other sizes, to which this invention is applicable likewise.

Next, the crystal vibration plate 2 and the first and second resin films 3 and 4, which are structural elements of the crystal vibrator 1, are hereinafter described.

The crystal vibration plate 2 according to this embodiment is an AT-cut crystal plate obtained by processing a crystal plate through 35° 15' rotation around X axis which is a crystal axis. In this crystal vibration plate 2, new axes after the rotation are respectively Y' axis and Z' axis, and front and back main surfaces of this plate are XZ' planes.

In the XZ' plane, the X-axis direction refers to a direction along short sides of the rectangular crystal vibration plate 2 rectangular in plan view (vertical direction on FIGS. 2 and 4), and the Z'-axis direction refers to a direction along long sides of the rectangular crystal vibration plate 2 (lateral direction on FIGS. 2 and 4). This direction along long sides of the crystal vibration plate 2 (Z'-axis direction) refers to a direction along one of two pairs of opposing sides of the crystal vibration plate 2 rectangular in plan view.

The crystal vibration plate 2 includes a vibrating portion 21, an outer frame 23, and a coupling portion 24. The vibrating portion 21 is substantially rectangular in plan view. The outer frame 23 surrounds the vibrating portion 21 with a penetrating portion 24 being interposed therebetween. The coupling portion 24 couples the vibrating portion 21 to the outer frame 23. The vibrating portion 21, outer frame 23 and coupling portion 24 are formed as an integral unit. The vibrating portion 21 and the coupling portion 24 are smaller in thickness than the outer frame 23. Circumferential edges of the first and second resin films 3 and 4 are joined to the outer frame 23 to allow these resin films to cover the vibration portion 21 thinner than the outer frame 23. As a result, an internal space is formed, in which the vibrating portion is enclosed and sealed.

In this embodiment, the vibrating portion 21 substantially rectangular in plan view is coupled to the outer frame 23 through the coupling portion 24 formed at one position; one corner, of the rectangular shape. This may reduce a stress possibly acted upon the vibrating portion 21, as compared with this portion being coupled to the outer frame at two or more positions.

In this embodiment, the coupling portion 24 protrudes from one side in the X-axis direction of an inner circumference of the outer frame 23 and then extends in the Z'-axis direction. The crystal vibration plate 2 has, at its both ends in the Z'-axis direction, first and second mounting terminals 27 and 28, and these mounting terminals 27 and 28 are directly joined to, for example, a circuit board with a solder. As a result of these structural features, a contraction stress may possibly be generated in the long-side direction of the crystal vibrator (Z'-axis direction) and transmitted to the vibrating portion, in which case the crystal vibrator's oscillation frequency may be easily variable.

In this embodiment, however, the coupling portion 24 is formed in a direction in which the contraction stress is transmittable, and the contraction stress may be thus difficult to transmit to the vibrating portion 21. This may control possible variability of the oscillation frequency at the time of mounting the crystal vibrator 1 to a circuit board.

The vibrating portion 21 has, on its front and back main surfaces, a pair of first and second driving electrodes 25 and 26. In the outer frame 23 at both ends in the long-side direction of the rectangular crystal vibration plate 2 (lateral direction on FIGS. 2 to 4), the first and second mounting terminals 27 and 28 are formed in the short-side direction of the crystal vibration plate 2 (vertical direction on FIGS. 2 and 4), and these first and second mounting terminals 27 and 28 are respectively connected to the first and second driving electrodes 25 and 26. The first and second mounting terminals 27 and 28 are used to mount the crystal vibrator 1 to a target member, for example, a circuit board.

On one of the main surfaces, the first mounting terminal 27 is continuous to a first sealing pattern 201 having a rectangular frame-like shape described later, as illustrated in FIG. 2. On the other main surface, the second mounting terminal 28 is continuous to a second sealing pattern 202 having a rectangular frame-like shape described later, as illustrated in FIG. 4.

Thus, the first and second mounting terminals 27 and 28 are formed at both ends of the crystal vibration plate 2 in the long-side direction (Z'-axis direction) across the vibrating portion 21 interposed between these mounting terminals.

The first mounting terminals 27 on the main surfaces of the crystal vibration plate 2 are electrically interconnected, and the second mounting terminals 28 on the main surfaces of the crystal vibration plate 2 are also electrically interconnected. In this embodiment, the first mounting terminals 27 and the second mounting terminals 28 are respectively electrically interconnected through electrodes routed along the lateral surfaces of opposing long sides of the crystal vibration plate 2, and are also electrically interconnected through electrodes routed along the lateral surfaces of opposing short sides of the crystal vibration plate 2.

On the front surface side of the crystal vibration plate 2 is formed a first sealing pattern 201 to which the first resin film 3 is joined. The first sealing pattern 201 is formed in a rectangular frame-like shape in a manner that surrounds the substantially rectangular vibrating portion 21. The first sealing pattern 201 includes a connecting portion 201a, first extended portions 201b, and a second extended portion 201c. The connecting portion 201a is continuous to the first mounting terminal 27. The first extended portions 201b extend from both ends of the connecting portion 201a in the long-side direction of the crystal vibration plate 2. The second extended portion 201c extends in the short-side direction of the crystal vibration plate 2 and serves to connect ends of extension of the first extended portions 201b. The second extended portion 201c is connected to a first extraction electrode 203 extracted from the first driving electrode 25. The first mounting terminal 27, therefore, is electrically connected to the first driving electrode 25 through the first extraction electrode 203 and the first sealing pattern 201. There is an electrode-less region 205a; region where no electrode is formed, between the second mounting terminal 28 and the second extended portion 201c extending in the short-side direction of the crystal vibration plate 2. The electrode-less region 205a is thus formed to ensure that the first sealing pattern 201 and the second mounting terminal 28 are electrically insulated from each other. This electrode-less region 205a constitutes an insulating groove 36, which will be described later, between the second mounting terminal 28 and the second extended portion 201c of the first sealing pattern 201.

On the back surface side of the crystal vibration plate 2 is formed a second sealing pattern 202 to which the second resin film 4 is joined, as illustrated in FIG. 4. The second sealing pattern 202 is formed in a rectangular frame-like shape in a manner that surrounds the substantially rectangular vibrating portion 21. The second sealing pattern 202 includes a connecting portion 202a, first extended portions 202b, and a second extended portion 202c. The connecting portion 202a is continuous to the second mounting terminal 28. The first extended portions 202b extend from both ends of the connecting portion 202a in the long-side direction of the crystal vibration plate 2. The second extended portion 202c extends in the short-side direction of the crystal vibration plate 2 and serves to connect ends of extension of the first extended portions 202b. The connecting portion 202a is connected to a second extraction electrode 204 extracted from the second driving electrode 26. The second mounting terminal 28, therefore, is electrically connected to the second driving electrode 26 through the second extraction electrode 204 and the second sealing pattern 202. There is an electrode-less region 206a; region where no electrode is formed, between the first mounting terminal 27 and the second extended portion 202c extending in the short-side direction of the crystal vibration plate 2. The electrode-less region 206a is thus formed to ensure that the second sealing pattern 202 and the first mounting terminal 27 are electrically insulated from each other. This electrode-less region 206a constitutes an insulating groove 37, which will be described later, between the first mounting terminal 27 and the second extended portion 202c of the second sealing pattern 202.

As illustrated in FIG. 2, the first extended portions 201b of the first sealing pattern 201 extending in the long-side direction of the crystal vibration plate 201b are smaller in width than the outer frame 23 extending in the long-side direction. This drawing also shows electrode-less regions 205b and electrode-less regions 207b; regions where no electrode is formed, on both sides of the first extended portions 201b in the direction of width (vertical direction on FIG. 2).

Of the electrode-less regions 205b and the electrode-less regions 207b on both sides of the first extended portions 201b, one end side of the electrode-less region 205b, 205b on the outer side is extending as far as the first mounting terminal 27, while the other end side of the electrode-less region 205b, 205b is continuous to the electrode-less region 205a (36) between the second mounting terminal 28 and the second extended portion 201c. On the outer side of the connecting portion 201a, first extended portions 201b, and second extended portion 201c of the first sealing pattern 201 are thus formed the electrode-less regions substantially equal in width. These electrode-less regions extend along one of the first extended portions 201b from the outer side at one end of the connecting portion 201a extending in the short-side direction of the crystal vibration plate 2, then extend from the end of that extension along the second extended portion 201c, and further extend from the end of that extension along the other one of the first extended portions 201b toward the outer side at the other end of the connecting portion 201a.

An electrode-less region 207a is formed on the inner side in the direction of width of the connecting portion 201a of the first sealing pattern 201, and both ends of this electrode-less region 207a are continuous to the electrode-less regions 207b on the inner side in the direction of width of the first extended portions 201b. An electrode-less region 207c is formed on the inner side in the direction of width of the second extended portion 201c, except the first extraction electrode 203 at the coupling portion 24. The electrode-less region 207c is continuous to the electrode-less regions 207b on the inner side of the first extended portions 201b. On the inner side in the direction of width of the connecting portion 201a, first extended portions 201b, and second extended portion 201c of the first sealing pattern 201 are thus formed the electrode-less regions 207a, 207b, 207c and 207b substantially equal in width and having a rectangular, frame-like shape in plan view, except the first extraction electrode 203 at the coupling portion 24.

As illustrated in FIG. 4, the first extended portions 202b of the second sealing pattern 202 extending in the long-side direction of the crystal vibration plate 2 are smaller in width than the outer frame 23 extending in the long-side direction. This drawing also shows that there are electrode-less regions 206b and electrode-less regions 208b; regions where no electrode is formed, on both sides of the first extended portions 201b in the direction of width (vertical direction on FIG. 4).

Of the electrode-less regions 206b and 208b on both sides of the first extended portions 202b, one end side of the electrode-less region 206b, 206b on the outer side is extending as far as the second mounting terminal 28, while the other end side of the electrode-less region 206b, 206b is continuous to the electrode-less region 206a (37) between the first mounting terminal 27 and the second extended portion 202c. On the outer side of the connecting portion 202a, first extended portions 202b, and second extended portion 202c of the second sealing pattern 202 are thus formed the electrode-less regions substantially equal in width. These electrode-less regions extend along one of the first extended portions 202b from the outer side at one end of the connecting portion 202a extending in the short-side direction of the crystal vibration plate 2, then extend from the end of that extension along the second extended portion 202c, and further extend from the end of that extension along the other one of the first extended portions 202b toward the outer side at the other end of the connecting portion 201a.

An electrode-less region 208a is formed on the inner side in the direction of width of the connecting portion 202a of the second sealing pattern 202, except the second extraction electrode 204 at the coupling portion 24. Both ends of this electrode-less region 208a are continuous to the electrode-less regions 208b on the inner side of the first extended portions 202b. An electrode-less region 208c is formed on the inner side in the direction of width of the second extended portion 202c. This electrode-less region 208c is continuous to the electrode-less regions 208b on the inner side of the first extended portions 201b. On the inner side in the direction of width of the connecting portion 202a, first extended portions 202b, and second extended portion 202c of the second sealing pattern 202 are thus formed the electrode-less regions 208a, 208b, 208c and 208b substantially equal in width and having a rectangular frame-like shape in plan view, except the second extraction electrode 204 at the coupling portion 24.

As described above, the first extended portions 201b and 202b of the first and second sealing patterns 201 and 202 are narrowed to be smaller in width than the outer frame 23, the electrode-less regions 205b, 207b, 206b 208b are disposed on both sides in the direction of width of the first extended portions 201b and 202b, and the electrode-less regions 207a, 207c, 208a and 208c are disposed on the inner side in the direction of width of the connecting portions 201a and 202a and the second extended portions 201c and 202c. To form these electrode-less regions 205b, 207a, 207b, 207c, 206b, 208a, 208b and 208c, the first and second sealing patterns 201 and 202 extended around the lateral surfaces of the outer frame 23 at the time of sputtering, are subjected to patterning using photolithography and then removed by metal etching. This may successfully avoid the risk of short circuit that possibly occurs when the first and second sealing patterns 201 and 202 are extended around and left on lateral surfaces of the outer frame 23.

The first mounting terminals 27 on the main surfaces are thus electrically connected to each other, and the second mounting terminals 28 on the main surfaces are also electrically connected to each other. Therefore, either one of the main surfaces on the front and back sides may be used for the crystal vibrator 1 to be mounted to a target member, for example, a circuit board.

The first and second resin films 3 and 4, which are rectangular films, are bonded to front and back surfaces of the crystal vibration plate 2 to seal the vibrating portion 21 of the crystal vibration plate 2. The rectangular first and second resin films 3 and 4 are so sized that covers a rectangular region of the crystal vibration plate 2 except the first and second mounting terminals 27 and 28 at both ends in the longitudinal direction of this vibration plate 2, and these first and second resin films 3 are bonded to this rectangular region.

In this embodiment, the first and second resin films 3 and 4 are heat-resistant resin films, for example, films made of a polyimide resin, and these films have heat resistance to high temperatures up to approximately 300° C. The first and second resin films 3 and 4 made of a polyimide resin are essentially transparent, however, may possibly be opaque depending on certain conditions of pressure bonding under heat. The first and second resin films 3 and 4 may be optionally transparent, semi-transparent, or opaque.

The material(s) of the first and second resin films 3 and 4 may not necessarily be selected from the polyimide resins and may be selected from resins classified in the category of super engineering plastics, specific examples of which may include polyamide resins and polyether ether ketone resins.

The first and second resin films 3 and 4 have thermoplastic adhesive layers in the entire areas of their front and back surfaces. In the first and second resin films 3 and 4, circumferential ends of their rectangular shapes are joined under heat, for example, by hot pressing, to the outer frame 23 on the front and back surfaces of the crystal vibration plate 2 in a manner that the vibrating portion 21 is sealed with these resin films.

By thus using the heat-resistant resin films as the first and second resin films 3 and 4, the first and second resin films 3 and 4 may be resistant to high temperatures and thus unlikely to deform during the reflow soldering when the crystal vibrator 1 is mounted by soldering to, for example, a circuit board.

When the crystal vibrator 1 is mounted by soldering to, for example, a circuit board, an unfavorable event conventionally referred to as "solder leaching" may occur, possibly inviting the risk of conduction failure. The solder leaching refers to diffusion of Au included in metal layers of the first and second mounting terminals 27 and 28 into the solder adhered to these mounting terminals. This embodiment employs the following means against the solder leaching and resulting conduction failure.

FIG. 5 is a schematic enlarged view in cross section of FIG. 3 to illustrate film structures of the first and second driving electrodes 25 and 26 and of the first and second mounting terminals 27 and 28. FIG. 6 is an enlarged view of a rectangular section "A" illustrated in FIG. 5. In FIG. 6, the drawing of FIG. 5 is turned upside down to locate the outer frame 23 on the crystal-substrate side at the bottom, and the metal films are illustrated in hatching.

The mounting terminals 27 and 28 each include a metal film 13 for mounting purpose and a metal film for driving purpose. The metal film 13 for mounting purpose is formed on the crystal substrate constituting the crystal vibration plate 2, and the metal film for driving purpose is formed on the metal film 13 for mounting purpose.

The metal film 13 for mounting purpose according to this embodiment includes a Ti film 30; ground layer, an Ni—Ti alloy film 30; solder-resistant metal film, and an Au film 32; solder wettability improver. The solder-resistant metal film is not necessarily limited to the Ni—Ti alloy film 31 but may be selected from other metal films, for example, Ni films.

The metal film 14 for driving purpose disposed on the metal film for mounting purpose includes a Ti film 33, an Au film 34 and a Ti film 35. The Ti films 33 and 35 of the metal film 14 for driving purpose may be selected from other metal films, for example, Cr films.

In the first, second mounting terminal 27, 28, the Ti film 35 is the uppermost layer of the metal film 14 for driving purpose on the metal film 13 for mounting purpose. The uppermost layer using the Ti film 35 may provide a better bonding strength to the first, second resin film 3, 4 than the uppermost layer using the Au film 34.

The metal film 14 for driving purpose has a layer structure similar to that of the first, second driving electrode 25, 26. The metal films 14 for driving purpose on the metal films 13 for mounting purpose of the first and second mounting terminals 27 and 28 are respectively formed in continuity with the metal films 14 for driving purpose constituting the first and second driving electrodes.

Thus, the metal films 14 for driving purpose constitute the first sealing pattern 201 and the first extraction electrode 203 used to electrically interconnect the first mounting terminal 27 and the first driving electrode 25. Similarly, the metal films 14 for driving purpose constitute the second sealing pattern 202 and the second extraction electrode 204 used to electrically interconnect the second mounting terminal 28 and the second driving electrode 26.

On the front surface side of crystal vibration plate 2; one main surface side of this vibration plate, is formed an insulating groove 36 constituting the electrode-less region 205*a* for electrical insulation between the first sealing pattern 201 and the second mounting terminal 28. On the back surface side of crystal vibration plate 2; another surface side of this vibration plate, is formed an insulating groove 47 constituting the electrode-less region 206*a* for electrical insulation between the second sealing pattern 202 and the first mounting terminal 27.

A dividing groove 38 is formed in the first mounting terminal 27 on the front surface side which is located correspondingly to the insulating groove 37 (206*a*) on the back surface side. This dividing groove 38 is formed in order to divide the metal film 14 for driving purpose on the metal film 13 for mounting purpose of the first mounting terminal 27 and the Au film 32 which is a part of the metal film 13 for mounting purpose into inner and outer regions in the long-side direction of the crystal vibration plate 2 (lateral direction on FIG. 5) and thereby expose the solder-resistant metal film; Ni—Ti alloy film 31. A dividing groove 39 is formed in the second mounting terminal 28 on the back surface side which is located correspondingly to the insulating groove 36 (205*a*) on the front surface side. This dividing groove 39 is formed to divide the metal film 14 for driving purpose on the metal film 13 for mounting purpose of the first mounting terminal 28 and the Au film 32 which is a part of the metal film 13 for mounting purpose into inner and outer regions in the long-side direction of the crystal vibration plate 2 (lateral direction on FIGS. 5 and 6) and thereby expose the solder-resistant metal film; Ni—Ti alloy film 31.

As illustrated in FIGS. 2 and 4, the dividing grooves 38 and 39 are formed in a manner that they traverse the long-side direction of the crystal vibration plate 2. In the illustrated example, these dividing grooves are formed in a manner that they are orthogonal to the long-side direction.

As illustrated in FIG. 5, the dividing groove 38 divides the metal film 14 for driving purpose and the Au film 32 of the metal film 13 for mounting purpose of the first mounting terminal 27 into two regions; an outer region, i.e., region closer to one end in the long-side direction (leftward region on FIG. 5), and an inner region, i.e., region closer to the vibrating portion 21 (rightward region on FIG. 5). Similarly, the dividing groove 39 divides the metal film 14 for driving purpose and the Au film 32 of the metal film 13 for mounting purpose of the second mounting terminal 28 into two regions; an outer region, i.e., region closer to the other end in the long-side direction (rightward region on FIG. 5), and an inner region, i.e., region closer to the vibrating portion 21 (leftward region on FIG. 5). Thus, the metal films 14 for driving purpose and the Au films 32 of the metal films 13 for mounting purpose of the first and second mounting terminals 27 and 28 are each divided into the outer and inner regions by the dividing grooves 38 and 39 respectively exposing the solder-resistant metal films; Ni—Ti alloy films 31.

An unfavorable event; solder leaching, may possibly occur with the Au film 34 of the metal film 14 for driving purpose and/or the Au film 32 of the metal film for mounting purpose 13 on the outer side of the first, second mounting terminal 27, 28. Yet, the solder leaching may be prevented by the dividing groove 38, 39 exposing the solder-resistant metal film; Ni—Ti alloy film 31, from further spreading into a more inward region closer to the vibrating portion 21 than the dividing groove 38, 39.

The first and second mounting terminals 27 and 28 are completely isolated from the inner metal films by the insulating grooves 36 (205*a*) and 37 (206*a*). Therefore, the solder leaching, if occurs with the with the Au film 34 of the metal film 14 for driving purpose and/or the Au film 32 of the metal film for mounting purpose 13 of the first, second mounting terminal 27, 28, may be prevented from further spreading inward toward the vibrating portion 21.

The first and second resin films 3 and 4 are adhered to the front and back main surfaces of the crystal vibration plate 2 in a manner that covers the insulating grooves 36 (205*a*) and 37 (206*a*) and the dividing grooves 38 and 39 that are located correspondingly on the front and back surfaces. This may ensure that the solder does not advance into the insulating groove 36 (205*a*) or the insulating groove 37 (206*a*) or the dividing groove 38 or the dividing groove 39, successfully preventing the occurrence of solder leaching in the insulating grooves 36 (205*a*) and 37 (206*a*) and the dividing grooves 38 and 39.

Next, a manufacturing method for the crystal vibrator 1 according to this embodiment is hereinafter described.

FIGS. 7A to 7H are schematic view in cross section of steps of manufacturing the crystal vibrator 1, illustrating the crystal vibrator 1 in part in the state of a wafer.

First, an unprocessed AT-cut crystal wafer (AT-cut crystal plate) 5 is prepared, which is illustrated in FIG. 7A. Then, the external shape forming step described herein is performed to process the crystal wafer 5, as illustrated in FIG. 7B. In this step, the crystal wafer 5 is processed by, for example, wet etching using the technique of photolithography into pieces that constitute the external shape of a vibrator to be obtained; a plurality of crystal substrate pieces 2*a* and frame pieces supporting these substrate pieces (not illustrated in the drawings), and the crystal substrate pieces 2*a* are each processed to have an outer frame 23*a* and a vibrating portion 21*a* thinner than the outer frame 23*a*.

Next, the metal film 13 for mounting purpose including the Ni—Ti alloy film 30; solder-resistant metal film, is formed on the entire surface of each crystal substrate piece 2*a* by sputtering or vapor deposition and also by photolithography, as illustrated in FIG. 7C.

Next, the metal film for mounting purpose forming step described herein is performed to further process the crystal wafer 5, as illustrated in FIG. 7D. In this step, the metal film 13 for mounting purpose is subjected to patterning to remove this metal film 13 from any film-unneeded parts but the first and second mounting terminals 27*a* and 28*a*. For example, the metal film 13 for mounting purpose is removed from the vibrating portion 21*a* and insulating grooves 36*a* and 37*a*.

Then, the metal film 14 for driving purpose is formed on the entire surface of each crystal substrate piece 2*a* by sputtering or vapor deposition and also by photolithography, as illustrated in FIG. 7E.

Then, the metal film forming step described herein is performed, as illustrated in FIG. 7F. In this step, the metal film 14 for driving purpose is subjected to patterning to remove this metal film 14 from any film-unneeded parts and form the insulating grooves 36 and 37 and the dividing grooves 38 and 39. Thus, the crystal vibration plate is finally obtained.

In this embodiment, the adhering step described herein is further performed, as illustrated in FIG. 7G. In this step, the resin film 3a and 4a are adhered by pressure bonding under heat to the front and back main surfaces of each crystal substrate piece 2a in a manner that its main surfaces are uninterruptedly covered with these resin films to seal the vibrating portion 21a of each crystal substrate piece 2a.

The vibrating portions 21a are thus sealed with the resin films 3a and 4a in an inactive gas atmosphere using, for example, nitrogen gas Then, the separating step described herein is performed. In this step, the continuous resin films 3a and 4a are cut at appropriate positions correspondingly to the respective crystal vibration plates 2 in a manner that the first and second mounting terminals 27 and 28 are partly exposed to remove any unnecessary parts of the films are removed, and the crystal vibration plates 2 are thus separated into individual pieces.

As a result, the crystal vibrators 1 are obtained, as illustrated in FIGS. 1 and 5.

According to this embodiment, the first and second mounting terminals 27 and 28 adhered with a solder to, for example, a circuit board each have the metal film 13 for mounting purpose including the Ni—Ti alloy film 31; solder-resistant metal film. Although the solder leaching possibly occurs if the Au film 32 of the metal film 13 for mounting purpose and/or the metal film 14 for driving purpose on the metal film 13 diffuse into the solder, the Ni—Ti alloy film 31 may effectively prevent further spread of the solder leaching, consequently avoiding the risk of conduction failure.

In the first and second mounting terminals 27 and 28, the dividing grooves 38 and 39 exposing the solder-resistant Ni—Ti alloy films 31 are formed in the metal films 13 for mounting purpose and the metal films 14 for driving purpose on these metal films 13 to divide the Au films 32 of the metal film 13 for mounting purpose and the metal films 14 for driving purpose. These dividing grooves 38 and 39 are formed in a manner that traverse the long-side direction of the crystal vibration plate 2 at the right angle, thus dividing the Au films 32 of the metal films 13 for mounting purpose and the metal films 14 for driving purpose of the mounting terminals 27 and 28 into two regions; an outer region closer to one end in the long-side direction, and an inner region closer to the vibrating portion 21.

In case the solder leaching occurs in the Au film 34 of the metal film 14 for driving purpose and/or of the metal film 13 for mounting purpose on the outer side of the first and second mounting terminal 27, 28, the dividing groove 38, 39 exposing the solder-resistant Ni—Ti alloy film 31 may prevent the solder leaching from spreading more inward toward the vibrating portion 21 than the dividing groove 38, 39.

Further advantageously, the first and second resin films 3 and 4 are adhered to the front and back main surfaces of the crystal vibration plate 2 so as to cover the dividing grooves 38 and 39. This may ensure that the solder does not advance into the dividing groove 38 or 39, successfully preventing the solder leaching from spreading in the dividing groove 38 and/or 39.

The crystal vibration plate 2 have the first and second mounting terminals 27 and 28 that are respectively connected to the first and second driving electrodes 25 and 26. Conventionally, piezoelectric vibration pieces may be each housed in a box-shaped base equipped with mounting terminals and having an opening on its upper side. The crystal vibration plate 2 thus structured, however, makes such a conventional means unnecessary, eliminating the need for high-priced bases.

Further advantageously, the first and second resin films 3 and 4 are adhered to the front and back main surfaces of the crystal vibration plate 2 to seal the first and second driving electrodes 25 and 26. Conventionally, piezoelectric vibration pieces may be each housed in a box-shaped base having an opening on its upper side and air-tightly sealed with a lid bonded to the opening. This embodiment, however, may eliminate the need to prepare high-priced bases or lid members, leading to further cost reduction. This embodiment may also allow the obtained products to reduce in thickness (in height), as compared with the known art.

In the crystal vibrator 1 according to this embodiment, the vibrating portion 21 is sealed with the first and second resin films 3 and 4. The crystal vibrator 1 thus structured may be relatively inferior in air-tightness, as compared with the known art in which, for example, a vibration piece-mounted base is air-tightly sealed with a metal-made or glass-made lid member joined to the base. As a result, the resonance frequency of such a crystal vibrator 1 may be more likely to degrade with time than in the known art.

The standards for frequency deviations may be moderately regulated for BLE (Bluetooth (registered trademark) Low Energy), among all of the applications associated with the near field communication. The crystal vibrator 1, an inexpensive resin film-sealed vibrator, may be useful in such moderately regulated applications.

In the embodiment described above, the dividing grooves 38 and 39 are formed in a manner that traverse the long-side direction of the crystal vibration plate 2 at the right angle. The dividing grooves 38 and 39 may instead be formed in a manner that diagonally traverse the long-side direction of the crystal vibration plate 2, or may be either straight or curved grooves.

In other embodiments of this invention, the dividing grooves 38 and 39 may be dispensable and unused.

In the embodiment described earlier, the coupling portion 24 is formed at one position in one corner of the vibrating portion 21 substantially rectangular in plan view. The coupling portion(s) 24 may be formed at a different position(s), and the coupling portion(s) may be variable in width.

Instead of the crystal vibration plate provided with the penetrating portion, this embodiment is applicable to a crystal vibration plate having a reverse mesa structure in which the vibrating portion is reduced in thickness and its surrounding area is increased in thickness.

In the earlier embodiment, the first and second resin films 3 and 4 are adhered to the main surfaces on both sides of the crystal vibration plate 2. Instead, a resin film and a conventional lid may be respectively joined to one and the other one of the main surfaces of the crystal vibration plate 2 to seal the vibrating portion. In this instance, the Ti film 35; uppermost layer on the lid-joined main surface, may be unnecessary.

In the earlier embodiment, the first mounting terminals 27 and the second mounting terminals 28 on the main surfaces are electrically interconnected through routing electrodes on the lateral and end surfaces of the crystal vibration plate 2. Instead, the first mounting terminals 27 and the second mounting terminals 28 may be electrically interconnected through electrodes penetrating through the main surfaces, or may be electrically interconnected through both of the routing electrodes and the penetrating electrodes.

In the earlier embodiment, the first sealing pattern 201 is formed on one of the main surfaces of the crystal vibration plate 2 in a rectangular frame-like shape in a manner that surrounds the substantially rectangular vibrating portion 21, as illustrated in FIG. 2, and the second sealing pattern 202 is formed on the other main surface of the crystal vibration plate 2 in a rectangular frame-like shape in a manner that surrounds the substantially rectangular vibrating portion 21, as illustrated in FIG. 4. These rectangular frame-like first and second sealing patterns 201 and 202, however, may be dispensable and unused.

FIGS. 8 and 9 are a schematic plan view and a schematic bottom view of a crystal vibration plate 2₁ in which the first and sealing patterns 201 and 202 are unused.

In this crystal vibration plate 2₁, the first mounting terminal 27 is electrically connected to the first driving electrode 25 through a routing electrode 209 and a first extraction electrode 203, as illustrated in FIG. 8.

As illustrated in FIG. 9, the second mounting terminal 28 is electrically connected to the second driving electrode 26 through the extended second extraction electrode 204, as illustrated in FIG. 9.

Dividing grooves 38₁ and 39₁ are formed in a connecting portion between the routing electrode 209 and the first mounting terminal 27 and in a connecting portion between the extended second extraction electrode 204 and the second mounting terminal 28

Any other structural and technical features are similar to those described in the earlier embodiment.

The resin film may be a photosensitive resin film in the crystal vibration plate 2₁ in which the rectangular frame-like first and second sealing patterns 201 and 202 are unused.

For example, a crystal wafer may be prepared that has a plurality of the crystal vibration plates 2₁ arranged and supported in the form of a matrix, as illustrated in FIG. 7G. In this instance, a photosensitive resin film may be adhered to both of main surfaces of this crystal wafer, then exposed and developed to cover the first and second driving electrodes of the crystal vibration plate 2₁, and then partly removed by patterning and then cured, followed by division of the crystal wafer into pieces of crystal vibration plates.

The shape of the crystal vibration plate may be substantially rectangular in plan view, instead of an exactly rectangular shape in plan view described earlier. In some exemplified shapes, the crystal vibration plate may have chamfered corner parts or may have castellations formed by attaching electrodes to cutouts of the peripheral edges of the crystal vibration plate.

This invention is not necessarily limited to piezoelectric vibrators including crystal vibrators and may be applicable to piezoelectric vibration devices including piezoelectric oscillators.

REFERENCE SIGNS LIST 1 crystal vibrator
2 crystal vibration plate
3 first resin film
4 second resin film
5 crystal wafer
13 metal film for mounting purpose
14 metal film for driving purpose
21 vibrating portion
23 outer frame
24 coupling portion
25 first driving electrode
26 second driving electrode
27 first mounting terminal
28 second mounting terminal 30, 33, 35 Ti film
31 Ni—Ti alloy film (solder-resistant metal film)
32, 34 Au film
38, 39 dividing groove
201 first sealing pattern
202 second sealing pattern

The invention claimed is:

1. A piezoelectric vibration plate, comprising:
a piezoelectric substrate having a substantially rectangular shape in plan view;
a first driving electrode and a second driving electrode formed on main surfaces on both sides of the piezoelectric substrate; and
a first mounting terminal and a second mounting terminal disposed at ends on both sides of the piezoelectric substrate in a direction along one of two pairs of opposing sides of the substantially rectangular shape in plan view, the first mounting terminal and the second mounting terminal being respectively connected to the first driving electrode and the second driving electrode,
the first mounting terminal and the second mounting terminal each comprising:
a metal film for mounting purpose formed on the piezoelectric substrate, the metal films for mounting purpose comprising a solder-resistant metal film; and
a metal film for driving purpose formed on the metal film for mounting purpose, the metal films for driving purpose being formed in continuity with the first driving electrode and the second driving electrode, the metal films for driving purpose constituting the first driving electrode and the second driving electrode, wherein
a dividing groove is formed in each of the metal films for mounting purpose and the metal films for driving purpose on the metal films for mounting purpose in a manner that traverses a direction along the one of two pairs of opposing sides of the piezoelectric substrate, and
the dividing groove divides the metal film for mounting purpose in part and the metal film for driving purpose in a manner that the solder-resistant metal film is exposed.

2. The piezoelectric vibration plate according to claim 1, wherein
the solder-resistant metal films each comprise at least one selected from the group consisting of Ni and Ni-containing alloys.

3. A piezoelectric vibration device, comprising:
a piezoelectric vibration plate, the piezoelectric vibration plate comprising:
a piezoelectric substrate having a substantially rectangular shape in plan view;
a first driving electrode and a second driving electrode formed on main surfaces on both sides of the piezoelectric substrate; and
a first mounting terminal and a second mounting terminal disposed at ends on both sides of the piezoelectric substrate in a direction along one of two pairs of opposing sides of the substantially rectangular shape in plan view, the first mounting terminal and the second mounting terminal being respectively connected to the first driving electrode and the second driving electrode,
the piezoelectric vibration device further comprising:
a first sealing member; and
a second sealing member,
the first sealing member and the second sealing member being respectively adherable to the main surfaces of the piezoelectric vibration plate in a manner that cover the first driving electrode and the second driving electrode of the piezoelectric vibration plate, at least one of the first sealing member or the second sealing member being a film including a resin, the first mounting terminal and the second mounting terminal each comprising:

a metal film for mounting purpose formed on the piezoelectric substrate, the metal films for mounting purpose each comprising a solder-resistant metal film; and a metal film for driving purpose formed on the metal film for mounting purpose, the metal films for driving purpose being formed in continuity with the first driving electrode and the second driving electrode, the metal films for driving purpose constituting the first driving electrode and the second driving electrode, wherein a dividing groove is formed in each of the metal films for mounting purpose and the metal films for driving purpose on the metal films for mounting purpose in a manner that traverses a direction along the one of two pairs of opposing sides of the piezoelectric substrate, and the dividing groove divides the metal film for mounting purpose in part and the metal film for driving purpose to allow exposure of the solder-resistant metal film.

4. The piezoelectric vibration device according to claim 3, wherein the first sealing member and the second sealing member are both the film including a resin.

5. The piezoelectric vibration device according to claim 4, wherein the piezoelectric vibration plate comprises:

a vibrating portion including the first driving electrode and the second driving electrode formed on the main surfaces of the piezoelectric substrate; and an outer frame coupled to the vibrating portion through a coupling means, the outer frame surrounding, at a position spaced from the vibrating portion, an outer circumference of the vibration portion smaller in thickness, and circumferential ends of the film including a resin are adhered to the outer frame to seal the vibrating portion.

6. The piezoelectric vibration device according to claim 3, wherein the film including a resin is adhered to the piezoelectric vibration plate in a manner that the dividing groove is covered with the film.

7. The piezoelectric vibration device according to claim 6, wherein the piezoelectric vibration plate comprises:

a vibrating portion including the first driving electrode and the second driving electrode formed on the main surfaces of the piezoelectric substrate; and an outer frame coupled to the vibrating portion through a coupling means, the outer frame surrounding, at a position spaced from the vibrating portion, an outer circumference of the vibration portion smaller in thickness, and circumferential ends of the film are adhered to the outer frame to seal the vibrating portion.

8. The piezoelectric vibration device according to claim 3, wherein the piezoelectric vibration plate comprises:

a vibrating portion including the first driving electrode and the second driving electrode formed on the main surfaces of the piezoelectric substrate; and an outer frame coupled to the vibrating portion through a coupling means, the outer frame surrounding, at a position spaced from the vibrating portion, an outer circumference of the vibration portion smaller in thickness, and circumferential ends of the film are adhered to the outer frame to seal the vibrating portion.

9. The piezoelectric vibration device according to claim 3, wherein one of main surfaces on both sides of the outer frame comprises a first sealing pattern to which the first sealing pattern is adhered, the first sealing pattern being formed in a manner that surrounds the vibrating portion and that allows the first driving electrode and the first mounting terminal to connect to each other, and another one of main surfaces the outer frame comprises a second sealing pattern to which the second sealing pattern is adhered, the second sealing pattern being formed in a manner that surrounds the vibrating portion and that allows the second driving electrode and the second mounting terminal to connect to each other.

10. The piezoelectric vibration device according to claim 3, wherein the first mounting terminal and the second mounting terminal are formed on both of the main surfaces of the outer frame.

11. The piezoelectric vibration device according to claim 3, wherein the solder-resistant metal films each comprise at least one selected from the group consisting of Ni and Ni-containing alloys.

12. A manufacturing method for a piezoelectric vibration device, the manufacturing method comprising preparing a piezoelectric wafer in order to provide a piezoelectric vibration plate comprising:

a piezoelectric substrate having a substantially rectangular shape in plan view;

a first driving electrode and a second driving electrode formed on main surfaces on both sides of the piezoelectric substrate; and a first mounting terminal and a second mounting terminal formed at ends on both sides of the piezoelectric substrate in a direction along one of two pairs of opposing sides of the substantially rectangular shape in plan view, the first mounting terminal and the second mounting terminal being respectively connected to the first driving electrode and the second driving electrode, the manufacturing method further comprising:

an external shape forming step of forming external shapes of a plurality of the piezoelectric substrates on the piezoelectric wafer;

a metal film for mounting purpose forming step of patterning a metal film for mounting purpose including a solder-resistant metal film on each of the piezoelectric substrates obtained in the external shape forming step to form the metal film for mounting purpose in regions that will constitute the first and second mounting terminals;

a metal film forming step of patterning a metal film for driving purpose on each of the piezoelectric substrates respectively having thereon the metal films for mounting purpose formed earlier in the metal film for mounting purpose forming step and on each of the metal films for mounting purpose to form the metal film for driving purpose in regions that will constitute the first and second mounting terminals and in regions that will constitute the first and second driving electrodes, thus obtaining the piezoelectric vibration plate;

an adhering step of adhering a film including a resin to at least one of the main surfaces in each of a plurality of the piezoelectric vibration plates respectively having thereon the metal films for driving purpose formed earlier in the metal film forming step to seal at least one of the first driving electrode or the second driving electrode; and a separating step of separating the piezoelectric vibration plates into individual pieces after the film is adhered thereto in the adhering step, the metal film forming step further comprising forming the metal films for driving purpose on the metal films for mounting purpose in regions that will constitute the first mounting terminal and the second mounting terminal in continuity with the metal films for driving purpose in regions that will constitute the first driving electrode and the second driving electrode, wherein in the metal film forming step, a dividing groove is formed in each of the metal films for mounting purpose and the metal films for driving purpose on the metal films for mounting purpose in a manner that traverses a direction along the one of two pairs of opposing sides of the piezoelectric substrate, and the dividing groove divides the metal film for mounting purpose in part and the metal film for driving purpose to allow exposure of the solder-resistant metal film.

13. The manufacturing method according to claim 12, wherein in the adhering step, the film including a resin is adhered to both of the main surfaces of the piezoelectric vibration plates respectively having thereon the metal films for driving purpose formed earlier in the metal film forming step to seal the first driving electrode and the second driving electrode.

14. The manufacturing method according to claim 12, wherein in the adhering step, the film including a resin is adhered to the piezoelectric vibration plate in a manner that the dividing groove is covered with the film.

* * * * *